United States Patent
Grunzweig et al.

(10) Patent No.: US 10,527,952 B2
(45) Date of Patent: Jan. 7, 2020

(54) FAULT DISCRIMINATION AND CALIBRATION OF SCATTEROMETRY OVERLAY TARGETS

(71) Applicant: KLA-Tencor Corporation, Milpitas, CA (US)

(72) Inventors: Tzahi Grunzweig, Hillsboro, OR (US); Jordan Pio, Portland, OR (US); Alexander Svizher, Haifa (IL)

(73) Assignee: KLA-Tencor Corporation, Milpitas, CA (US)

( * ) Notice: Subject to any disclaimer, the term of this patent is extended or adjusted under 35 U.S.C. 154(b) by 38 days.

(21) Appl. No.: 15/576,602

(22) PCT Filed: Oct. 24, 2017

(86) PCT No.: PCT/US2017/058118
§ 371 (c)(1),
(2) Date: Nov. 22, 2017

(87) PCT Pub. No.: WO2018/081147
PCT Pub. Date: May 3, 2018

(65) Prior Publication Data
US 2018/0373167 A1 Dec. 27, 2018

Related U.S. Application Data

(60) Provisional application No. 62/412,730, filed on Oct. 25, 2016.

(51) Int. Cl.
*G03F 7/20* (2006.01)
*H01L 23/544* (2006.01)
*H01L 21/66* (2006.01)

(52) U.S. Cl.
CPC ...... *G03F 7/70633* (2013.01); *G03F 7/70683* (2013.01); *H01L 22/00* (2013.01); *H01L 23/544* (2013.01)

(58) Field of Classification Search
CPC ......... G01B 11/02; G01B 11/14; G01B 11/24; G01B 11/27; G01N 21/4788;
(Continued)

(56) References Cited

U.S. PATENT DOCUMENTS 7,046,361 B1 5/2006 Yang et al.
2003/0190793 A1* 10/2003 Brill ................... G01N 21/4788
438/401

(Continued)

FOREIGN PATENT DOCUMENTS

WO 2015157464 A1 10/2015

OTHER PUBLICATIONS

ISA/KR, International Search Report and Written Opinion for PCT/US2017/058118 dated Jan. 18, 2018.

*Primary Examiner* — Gordon J Stock, Jr.
(74) *Attorney, Agent, or Firm* — Hodgson Russ LLP

(57) ABSTRACT

Scatterometry overlay targets and measurement methods are provided, which are configured to detect and eliminate process-related errors and illumination-related errors from overlay measurements of the targets. Targets comprise at least three cells associated with a measurement direction, wherein at least two of the cells comprise periodic structures at different target layers, having a same pitch and opposite offsets between the two cells, and at least an additional cell comprises a periodic structure with the same pitch at only one of the target layers. The additional cell(s) are used to detect irregularities in the respective periodic structure(s), enable estimation of process quality, provide reference images, enhance metrology simulations and provide mitigation of errors in critical process steps. Measurement methods incorporate scatterometry measurements ion the additional cell(s) for these purposes.

26 Claims, 4 Drawing Sheets

(58) Field of Classification Search
CPC .............. G01N 21/9501; G01N 21/956; G03F 7/70633; G03F 7/70616; G03F 7/70625; G03F 7/70683; G03F 7/70516; H01L 22/00; H01L 22/12; H01L 23/544
USPC ......... 356/399–401; 382/151; 430/5, 22, 30; 355/53, 55, 77; 250/548; 438/7, 16, 401; 257/797
See application file for complete search history.

(56) References Cited

U.S. PATENT DOCUMENTS

| | | | | |
|---|---|---|---|---|
| 2005/0012928 | A1* | 1/2005 | Sezginer | G01B 11/26 356/401 |
| 2007/0229829 | A1 | 10/2007 | Kandel et al. | |
| 2010/0175033 | A1* | 7/2010 | Adel | G03F 7/705 716/52 |
| 2013/0342831 | A1 | 12/2013 | Levinski et al. | |
| 2014/0060148 | A1* | 3/2014 | Amit | G01B 21/042 73/1.79 |
| 2014/0375984 | A1* | 12/2014 | Choi | G01N 21/93 356/73 |
| 2015/0177135 | A1* | 6/2015 | Amit | G01N 21/47 702/150 |
| 2015/0204664 | A1 | 7/2015 | Bringoltz et al. | |
| 2015/0292877 | A1* | 10/2015 | Marciano | G01B 11/27 356/401 |
| 2015/0316490 | A1* | 11/2015 | Amit | G01N 21/8851 356/400 |
| 2015/0346605 | A1* | 12/2015 | Den Boef | G03F 7/705 438/401 |
| 2015/0355554 | A1* | 12/2015 | Mathijssen | G03F 9/7046 355/67 |
| 2016/0042105 | A1* | 2/2016 | Adel | G06F 17/5009 703/6 |
| 2016/0123894 | A1* | 5/2016 | Fu | G01B 11/0616 356/615 |
| 2016/0161245 | A1* | 6/2016 | Fu | G01B 11/24 250/208.2 |
| 2016/0290796 | A1* | 10/2016 | Levy | G01N 21/9501 |
| 2016/0313658 | A1* | 10/2016 | Marciano | G03F 9/7003 |
| 2017/0023358 | A1* | 1/2017 | Lee | G01J 9/00 |
| 2017/0060001 | A1* | 3/2017 | Adel | H01L 22/30 |

* cited by examiner

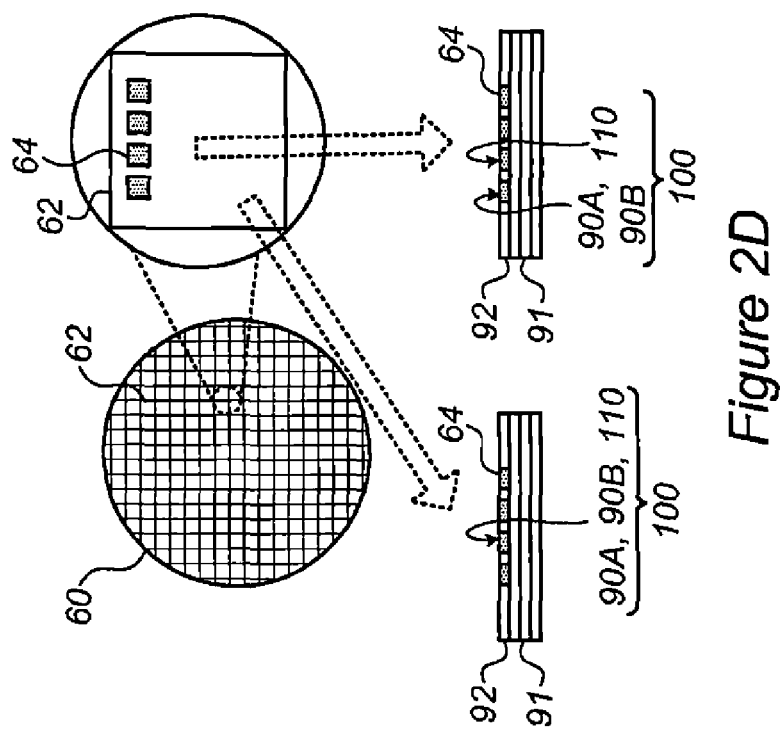
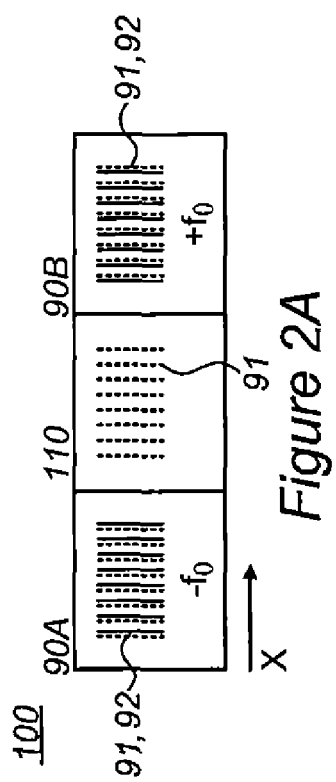
*Figure 2A*
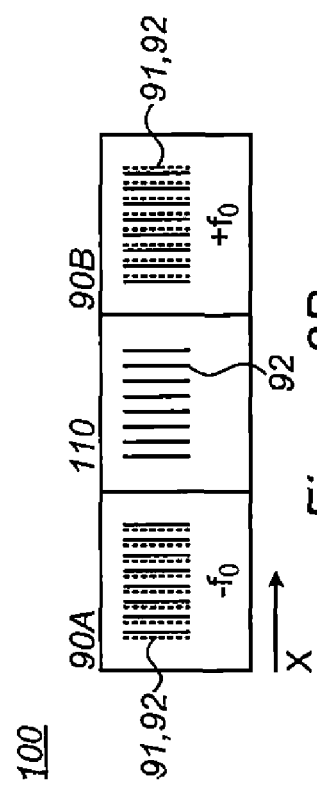
*Figure 2B*
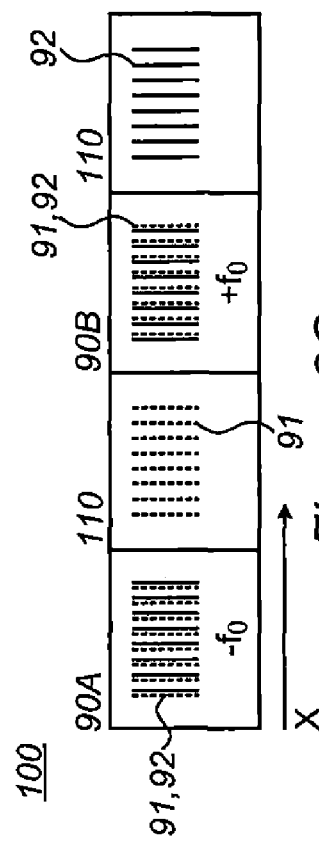
*Figure 2C*
*Figure 2D*

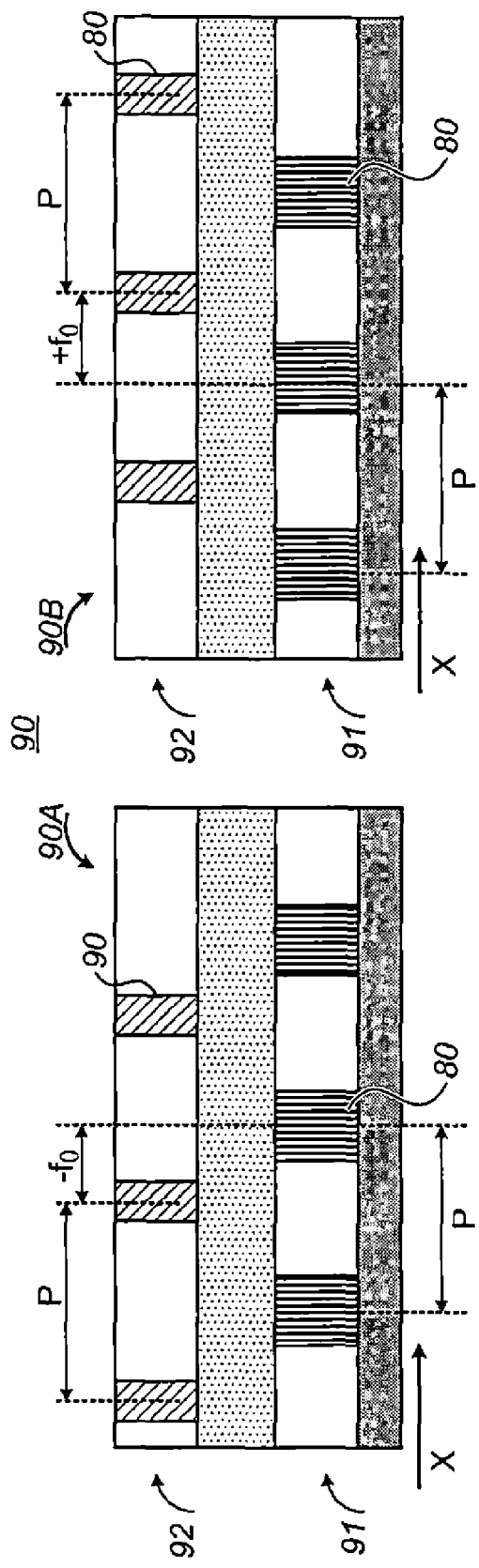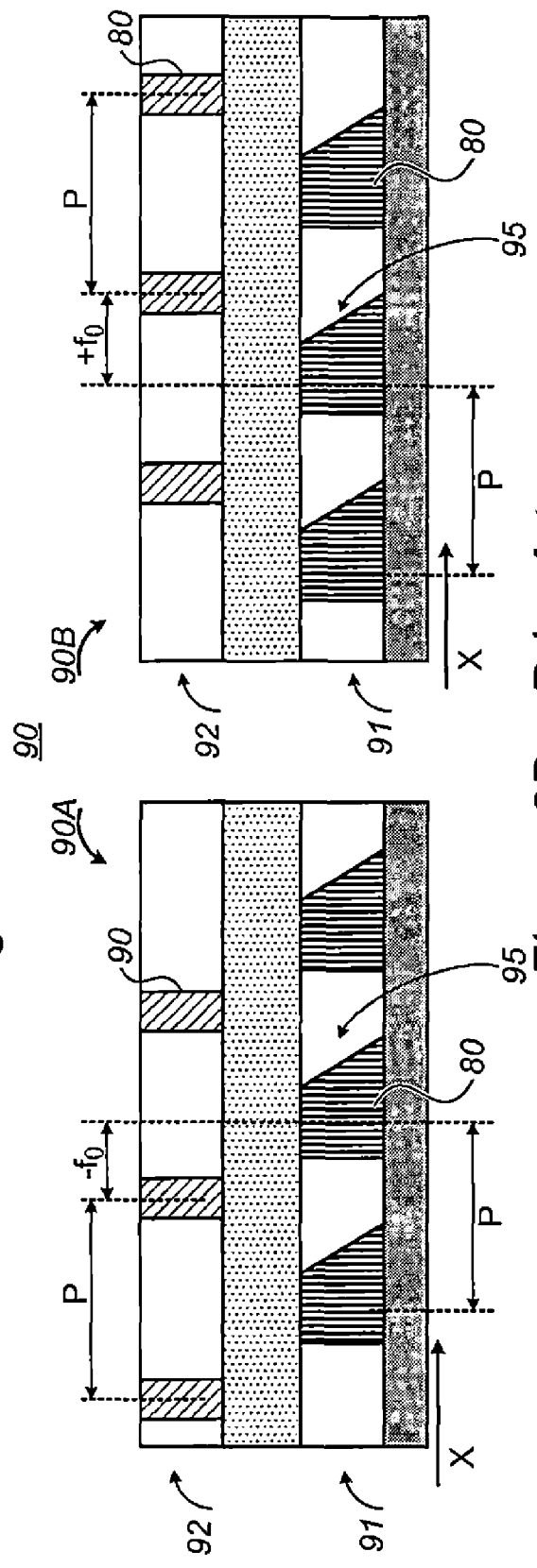
Figure 3A – Prior Art
Figure 3B – Prior Art

FAULT DISCRIMINATION AND CALIBRATION OF SCATTEROMETRY OVERLAY TARGETS

CROSS REFERENCE TO RELATED APPLICATIONS

This application claims the benefit of U.S. Provisional Patent Application No. 62/412,730 filed on Oct. 25, 2016, which is incorporated herein by reference in its entirety.

BACKGROUND OF THE INVENTION

1. Technical Field

The present invention relates to the field of metrology, and more particularly, to scatterometry overlay targets and scatterometry measurement methods

2. Discussion of Related Art

Metrology measurements are complex and essential in efficient photolithography production. Scatterometry overlay metrology is used to estimate overlays between layers in produced integrated circuits, by measurements of scatterometry targets and analysis of measured diffraction signals between periodic structures in different target layers, which are offset with respect to each other.

SUMMARY OF THE INVENTION

The following is a simplified summary providing an initial understanding of the invention. The summary does not necessarily identify key elements nor limits the scope of the invention, but merely serves as an introduction to the following description.

One aspect of the present invention provides a scatterometry overlay target comprising at least three cells associated with a measurement direction, wherein two of the at least three cells comprise periodic structures at different target layers, having a same pitch and opposite offsets between the two cells, and wherein at least a third cell of the at least three cells comprises a periodic structure with the same pitch at only one of the target layers.

These, additional, and/or other aspects and/or advantages of the present invention are set forth in the detailed description which follows; possibly inferable from the detailed description; and/or learnable by practice of the present invention.

BRIEF DESCRIPTION OF THE DRAWINGS

For a better understanding of embodiments of the invention and to show how the same may be carried into effect, reference will now be made, purely by way of example, to the accompanying drawings in which like numerals designate corresponding elements or sections throughout.

In the accompanying drawings:

FIGS. 2A-2D are high level schematic illustrations of various configurations of scatterometry overlay targets, according to some embodiments of the invention.

FIGS. 3A and 3B illustrate schematically cross section views of prior art scatterometry targets.

DETAILED DESCRIPTION OF THE INVENTION

Figure 1A:
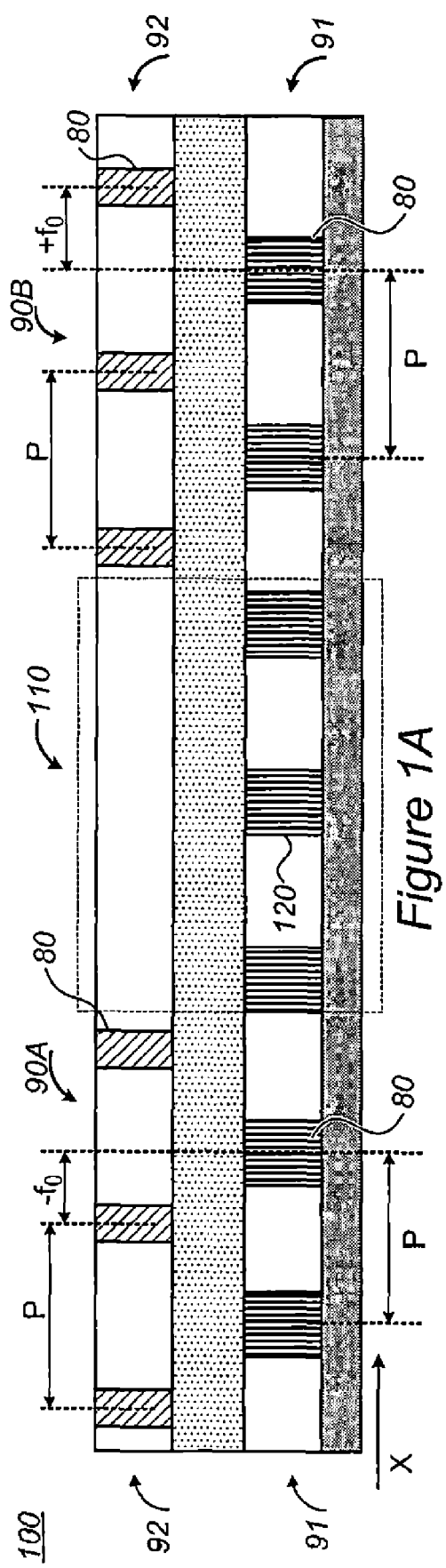
FIGS. 1A and 1B are high level schematic illustrations of scatterometry overlay targets, according to some embodiments of the invention.

In the following description, various aspects of the present invention are described. For purposes of explanation, specific configurations and details are set forth in order to provide a thorough understanding of the present invention. However, it will also be apparent to one skilled in the art that the present invention may be practiced without the specific details presented herein. Furthermore, well known features may have been omitted or simplified in order not to obscure the present invention. With specific reference to the drawings, it is stressed that the particulars shown are by way of example and for purposes of illustrative discussion of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

Before at least one embodiment of the invention is explained in detail, it is to be understood that the invention is not limited in its application to the details of construction and the arrangement of the components set forth in the following description or illustrated in the drawings. The invention is applicable to other embodiments that may be practiced or carried out in various ways as well as to combinations of the disclosed embodiments. Also, it is to be understood that the phraseology and terminology employed herein are for the purpose of description and should not be regarded as limiting.

Unless specifically stated otherwise, as apparent from the following discussions, it is appreciated that throughout the specification discussions utilizing terms such as "processing", "computing", "calculating", "determining", "enhancing", "deriving" or the like, refer to the action and/or processes of a computer or computing system, or similar electronic computing device, that manipulates and/or transforms data represented as physical, such as electronic, quantities within the computing system's registers and/or memories into other data similarly represented as physical quantities within the computing system's memories, registers or other such information storage, transmission or display devices.

Scatterometry overlay targets and measurement methods are provided, which are configured to detect and eliminate process-related errors and illumination-related errors from overlay measurements of the targets. Targets comprise at least three cells associated with a measurement direction, wherein at least two of the cells comprise periodic structures at different target layers, having a same pitch and opposite offsets between the two cells, and at least an additional cell comprises a periodic structure with the same pitch at only one of the target layers. The additional cell(s) are used to detect irregularities in the respective periodic structure(s), enable estimation of process quality, provide reference images, enhance metrology simulations and provide mitigation of errors in critical process steps. Measurement methods incorporate scatterometry measurements ion the additional cell(s) for these purposes, and may also be temporally graduated to provide quality estimation during the process.

Embodiments of the present invention provide efficient and economical methods and mechanisms for enhancing quality control of target production, enhancing the accuracy of metrology measurements and providing additional data, while using minimal, and adjustable wafer space and measurement time. Disclosed scatterometry overlay targets and measurement methods further provide fault discrimination and calibration of scatterometry overlay targets.

Figure 1B:
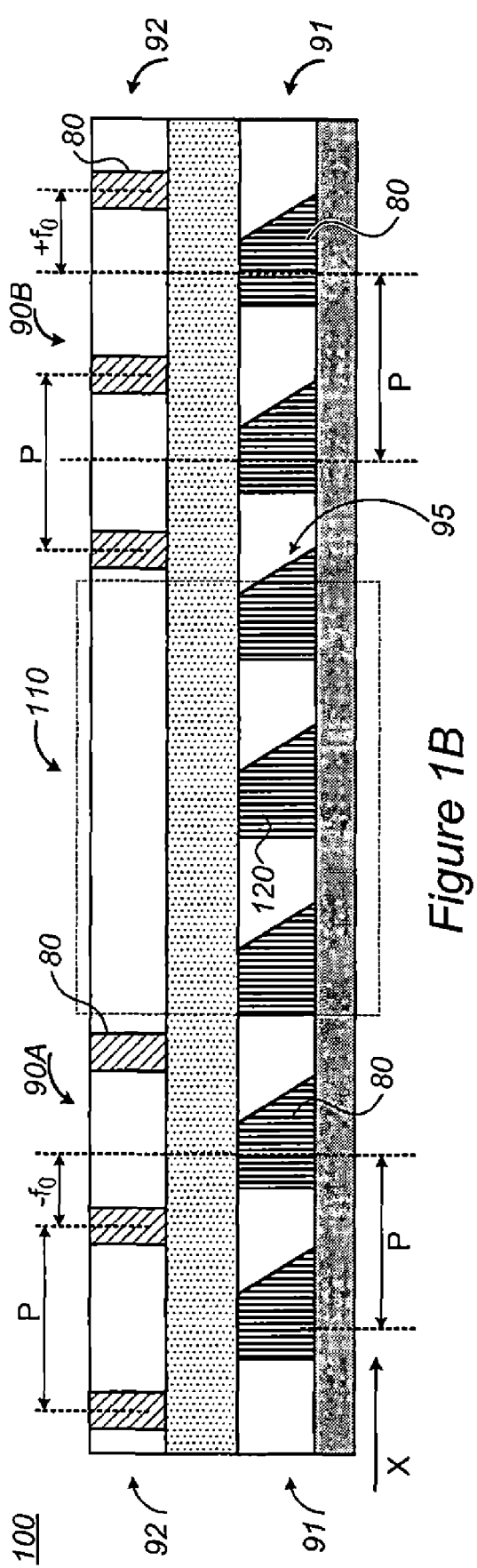

FIGS. 1A and 1B are high level schematic illustrations of a scatterometry overlay target 100, according to some embodiments of the invention. The illustrations depict schematically target cross section views which show disclosed layer and structure arrangements, without being limited to details of the illustrated structures such as numbers of elements, relative dimensions and so forth.

Scatterometry overlay targets 100 comprise at least three cells 90A, 90B, 100 which are associated with a measurement direction (denoted by X). Two of the at least three cells, namely cells 90A, 90B, comprise periodic structures 80 at different target layers 91, 92, having a same pitch (denoted by P) and opposite offsets between the two cells (denoted by $-f_0$ and $+f_0$ for cells 90A, 90B, respectively). At least a third cell 110 of the at least three cells comprises a periodic structure 120 with the same pitch (P) at only one of the target layers. It is noted that the term third cell is used herein merely as to distinguish respective cells 110 from prior art target cells 90A, 90B, which are denoted in a non-limiting manner as two of the at least three cells. This use is merely for convenience and clarity. Embodiments of the disclosed invention may comprise more than two cells 90A, 90B for each measurement direction, and additional ("third") cells 110 may comprise more than one additional ("third") cell 110 for each measurement direction, as disclosed below. In targets having more than one measurement direction, similar design principles may be applied to only one of the measurement directions, to some or to all of the measurement directions, e.g., to X and Y orthogonal measurement directions—with two or more cells 90A, 90B and one or more additional ("third") cell 110 in each direction. In particular, multi-layer targets 100, having periodic structures 80 at multiple target layers (e.g., three or four layers, or even more layers), typically comprise multiple SCOL cells (not shown) comparing periodic structures 80 at different layers, and correspondingly multiple additional cells 110, each comprising periodic structure 120 at a different layer. Disclosed targets and measurement methods may be applicable to multi-layer targets 100 according to the disclosed principles, taking into account the number of layers and corresponding target structures.

FIG. 1A illustrates schematically two layered target 100, yet disclosed targets 100 are not limited to two layers. FIG. 1A illustrates schematically periodic structure 120 in bottom, previous layer 91, yet disclosed targets 100 may comprise periodic structure 120 in top, current layer 92, or in intermediate layers in case of multilayered targets 100. FIG. 1A illustrates schematically periodic structure 120 being continuous to periodic structure 80 at the corresponding layer, such as to maintain periodicity of the overall structure (periodic structures 80, 120 in whole target 100 with cells 90A, 110, 90B having a single pitch in layer 91, throughout target 100). In certain embodiments, periodic structure 120 may also be discontinuous with respect to periodic structures 80. FIG. 1B illustrates schematically target 100 with defective periodic structures 80, 120, having side wall angles (SWA) due to some process defect. The inventors have found out that the design and measurement methods of targets 100 enable isolating and removing the error caused by the defect from the overlay measurement, using cell 110, as disclosed below. Advantageously, target designs 100 provide more accurate overlay measurements than prior art targets 90 shown below, which are also more robust with respect to process errors.

It is noted that disclosed targets and methods may be used to detect and remove errors introduced to overlay measurements by any process-related effect, e.g., grating damage due to constraints on the grating dimensions and/or due to imperfect compatibility with the lithography design rules, and/or due to the complexity and number of process steps between layers 91, 92. It is further noted that disclosed targets and methods may be used to detect and remove errors introduced to overlay measurements by any illumination-related effect (for properly or improperly produced target cells), e.g., by providing improved reference images and/or by improving given reference images, as disclosed below.

In certain embodiments, cell 110 may share any feature with cells 90A, 90B, not necessarily top or bottom grating as periodic structures 80, and be used to calibrate the shared feature. In any of the embodiments, cells 90A, 90B may be standard SCOL (scatterometry overlay) cells.

FIGS. 2A-2D are high level schematic illustrations of various configurations of scatterometry overlay target 100, according to some embodiments of the invention. The illustrations in FIGS. 2A-2C depict schematically top views of target cells and their respective structures. The figures relate structures to cells, without being accurate with respect to the relative spatial arrangement of structures in different cells. FIG. 2D combines schematic top views of a wafer 60, a die 62 with schematic cross section views of pads 64 in dies 62. None of FIGS. 2A-2D limits disclosed targets 100 with respect to details of the illustrated structures such as numbers of elements, relative dimensions, spatial arrangement of structures 80, 120 and cells 90A, 90B, 110 and so forth.

In certain embodiments, cell 110 may be a single cell positioned between two cells 90A, 90B with periodic structures 80 at different target layers 91, 92 and opposite offsets ($-f_0$, $+f_0$, respectively). Target layers 91, 92 may comprise a previous layer and a current layer and cell 110 may comprise periodic structure 120 at previous layer 91, as illustrates schematically in FIG. 2A. In certain embodiments, cell 110 may comprise periodic structure 120 at current layer 92, as illustrates schematically in FIG. 2B. In certain embodiments, one or more additional cells 110 may comprise two cells 110, and wherein the at least two cells having the respective periodic structures at the different target layers. In certain embodiments, one of cells 110 may comprise periodic structure 120 at previous layer 91 and another one of cells 110 may comprise periodic structure 120 at current layer 92, as illustrates schematically in FIG. 2C. Two or more cells 110 may be position at various spatial arrangements with respect to cells 90A, 90B, e.g., one, two or more cells 110 between cells 90A, 90B, one, two or more cells 110 adjacent to cells 90A, 90B, etc.

In certain embodiments, single cell 110 may be positioned adjacent to two cells 90A, 90B. For example, in certain embodiments, one or more cells 110 may be positioned adjacent to two cells 90A, 90B at position(s) which separate, spatially, target 100 from other wafer structures.

FIG. 2D illustrates schematically multiple dies 62 on wafer 60, with multiple pads 64 in each die 62. Pads 64 are typically positioned in current layer 92 of wafer 60. In various embodiments, cells 90A, 90B and cell(s) 110 of target 100 may be position in the area of same pad 64, possibly, cell(s) 110 may be positioned adjacent to cells 90A, 90B and on an edge of pad 64 holding cells 90A, 90B. For example, cell(s) 110 may be positioned at a different location on same pad 64 as cells 90A, 90B, for example toward the outer left or right edge of common pad 64, to physically separate cells 90A, 90B from nearby structures. In certain embodiments, cell(s) 110 may be positioned on different pad 64 with respect to pad 64 of cells 90A, 90B.

FIGS. 3A and 3B illustrate schematically cross section views of prior art scatterometry targets 90. Prior art targets 90 comprise two cells 90A, 90B with a common measurement direction (X), with periodic structure 80 having same pitch P at different layers 91, 92, typically termed previous (bottom) and current (top) layers, respectively. Designed offsets $-f_0$ and $+f_0$ (for cells 90A, 90B, respectively) are used to scale the effect of the overlay error between periodic structures 80 of layers 91, 92 on the resulting image (e.g., the grating over grating target provides a diffraction pattern which is analyzed and used to derive the overlay between the gratings). However, as illustrated schematically in FIG. 3B, process errors in any of structures 80 may contribute to the measured overlay and interpreted as part therefrom, as exemplified with asymmetric side wall angles (SWA) 95 in the illustration. Other prior art deficiencies in this respect are possible illumination non-uniformity effects (typically interpreted incorrectly as tool induced shifts, TIS) when using normalization of process defects by a reference image and effects of any other error contributions to the overlay measurements.

Advantageously, in disclosed embodiments, targets 100 provide measurements of various process defects (e.g., asymmetries such as different SWA 95) independently of the overlay, using measurements from cell(s) 110. For example, when using multiple cells 110 with periodic structures 120 in different layers, information concerning process errors in any of these layers may be derived independently, and be used to improve the accuracy of the overlay measurements.

Advantageously, disclosed targets 100, in particular target configurations in which cells 90A, 90B and 110 are on same pad 64, have a small footprint on wafer 60 (compared, e.g., to a three separate cells) and minimize the risk of pad to pad variation in the regular SCOL method (which is another source of inaccuracy in the prior art).

Certain embodiments comprise target design files of targets 100 disclosed herein. Certain embodiments comprise metrology measurements of targets 100 disclosed herein, and in particular metrology measurements comprising combinations of measurements of cells 110 and cells 90A, 90B.

Figure 4:
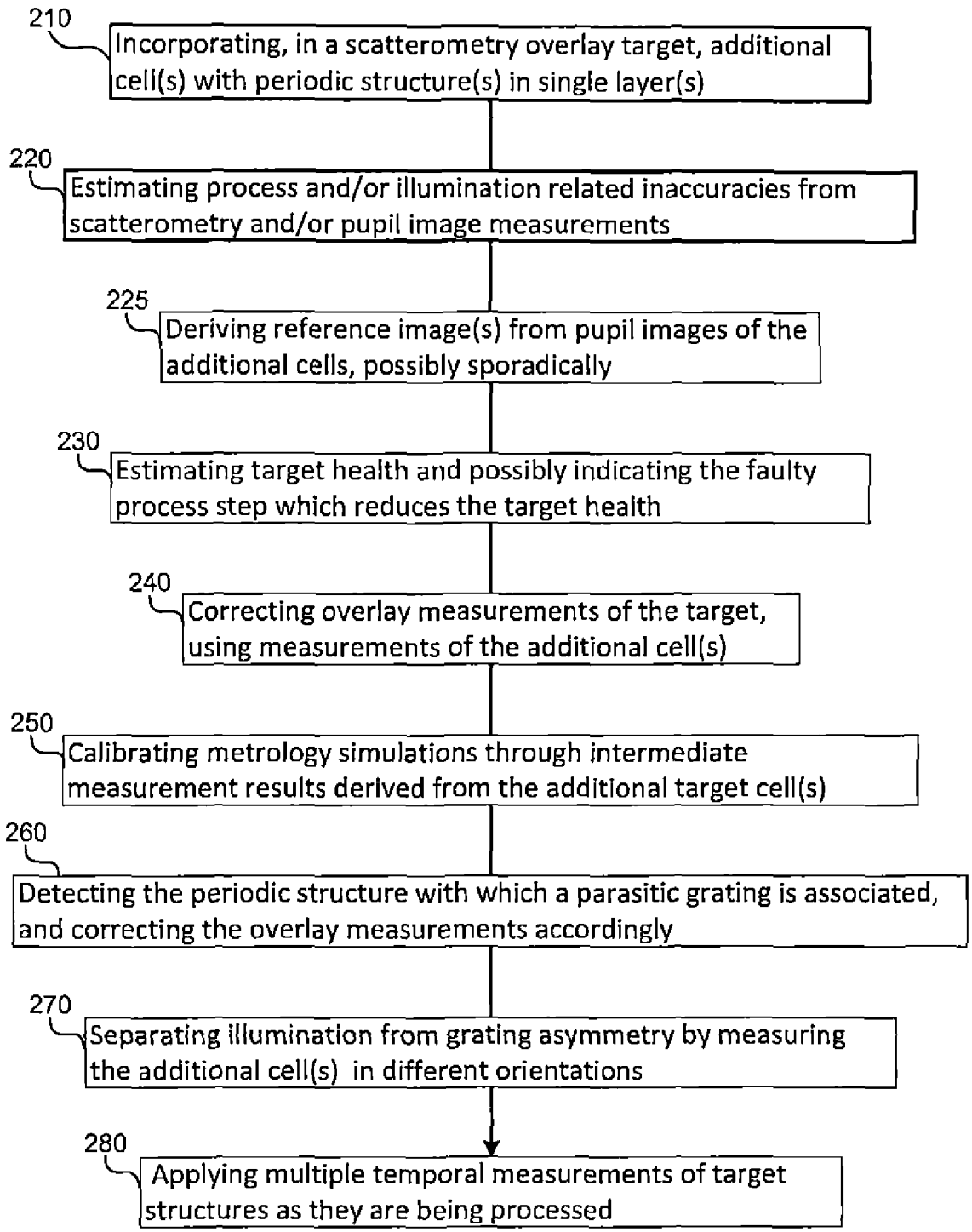
FIG. 4 is a high level flowchart illustrating a method, according to some embodiments of the invention.

FIG. 4 is a high level flowchart illustrating a method 200, according to some embodiments of the invention. Method 200 comprises target design stages and measurement stages, which may be carried out in combination or independently of each other. The method stages may be carried out with respect to targets 100 described above and/or using a metrology tool (not shown), either of which may optionally be configured to implement method 200. Method 200 may be at least partially implemented by at least one computer processor, e.g., in a target design module and/or in a metrology module. Certain embodiments comprise computer program products comprising a computer readable storage medium having computer readable program embodied therewith and configured to carry out the relevant stages of method 200. Certain embodiments comprise target design files of respective targets designed by embodiments of method 200. Method 200 may comprise the following stages, irrespective of their order.

Method 200 may comprise incorporating—in a scatterometry overlay target comprising two cells with periodic structures at different target layers, having a same pitch and opposite offsets between the two cells—at least a third (additional) cell comprising a periodic structure with the same pitch at only one of the target layers (stage 210). For example, the at least a third cell may comprise a single cell positioned between and/or adjacent to the two cells and having the periodic structure in the previous or current layer. For example, the at least a third cell may comprise at least two cells having the periodic structures in at least a previous and a current layers. Any additional embodiments described above may likewise provide design principles in methods 200.

Method 200 may comprise deriving an estimation of process-related inaccuracy from scatterometry measurements of the at least third cell and correcting a scatterometry overlay measurements based on the two cells by the process-related inaccuracy estimation and/or deriving an estimation of illumination-related inaccuracy from pupil image measurements of the at least third cell and correcting a scatterometry overlay measurements based on the two cells by the illumination-related inaccuracy estimation (stage 220).

Measurements of targets 100 may be carried out similarly to measurements of prior art cells 90 using scatterometry overlay (SCOL) procedures comprising directing illumination to third cell(s) 110 and collecting and measuring the scattered light, and using the difference between the plus first (+1) and minus first (−1) diffraction orders of the scattered light as a measure of the symmetry of periodic structure 120 (e.g., the bottom grating), without any scattering from periodic structures 80, e.g., in other layers. Cells 90A, 90B may be measured by SCOL procedures similarly to the measurement of prior art targets 90.

Measurements of third cell(s) 110 may be used as a flag that indicates the health of target 100 (e.g., the level of process errors it exhibits) and/or as calibration measurements to compensate for the effects of such process errors (e.g., asymmetric bottom gratings 91, different SWA 95, etc.). Alternatively or complementarily, information gathered from third cell(s) 110 such as scatterometry measures, pupil images and/or signals derived therefrom may be used as reference image(s) and/or signal(s) to eliminate illumination non-uniformity. In certain embodiments, a measured amount of grating asymmetry (of periodic structure 120) may be used as a flag to indicate the target's health. Possibly, the amount of grating asymmetry may be used to compensate for the effect of single grating asymmetry and/or illumination asymmetry on the overlay calculations.

Advantageously, with respect to prior art targets 90, targets 100 enable to detect faults in scatterometry overlay target and identify the faulty layer(s) and moreover, to provide calibration data for mitigating illumination light non-uniformity.

Certain embodiments comprise targets 100 configured to provide measurements of more than one measurement direction X, for example, additional cells may be provided perpendicularly to cells 90A, 90B, 110 to enable Y direction measurements, orthogonally to measurement direction X. Any of the disclosed configurations of targets 100, and of cell(s) 110 in particular, may be applied to one or two measurement directions, to detect process-related and/or illumination-related inaccuracies in any of the measurement directions.

In certain embodiments, method 200 may comprise deriving a reference image from pupil images of the additional cell(s) 110 (stage 225), instead of dedicating a time and measurement resources to derive the reference image separately from combined measurements of several targets in different orientations (typically 0° and 180°, i.e. rotation of the target), which may also suffer from additional incident light non-uniformity. In certain embodiments, the pupil image gathered from the additional (third) cell(s) may be used to compensate for illumination light non-uniformity, and eliminate the need for separate reference image creation (RIC) procedure. Beyond the sparing of time and resources, the pupil image of the additional (third) cell(s) is superior to prior art RIC images as it can be acquired within a short time before or after the measurement of the two (grating-over-grating) target cells, avoiding illumination changes between measurements. Moreover, the pupil image of the additional (third) cell(s) is superior to prior art RIC images in that it does not require measurements in two orientations (0° and 180°), potentially avoiding the need to make any measurements in 180°, and potentially increasing the reference image accuracy, as there is no sensitivity to 0° to 180° target location misses. In certain embodiments, method 200 may comprise measuring the additional cell(s) only sporadically to update the reference image when needed.

In certain embodiments, method 200 may comprise estimating target health (e.g., compliance with specified thresholds) and possibly indicating the faulty process step which reduces the target health (stage 230). Faulty process step indication may be carried out also for targets which are detected as not healthy by other ways, such as other metrics. Target health indications may then be used by the metrology tool for target selection procedures.

In certain embodiments, method 200 may comprise correcting overlay measurements of the target, using measurements of the third cell(s) with the periodic structure(s) in a single layer (stage 240). The correction may compensate, e.g., for inherent grating asymmetry (that, in the prior art, may be interpreted as overlay) and/or for other errors introduced by process steps.

In certain embodiments, method 200 may further comprise calibrating metrology simulations through intermediate measurement results derived from the additional target cell(s) (stage 250). The experimental intermediate results, scattering by the one grating of (each) additional cell, may be used to calibrate or verify correctness of simulations, using simpler, intermediate measurements, rather than the prior art's only possibility of using final measurements of the (grating-over-grating) target cells only for simulation validation.

In certain embodiments, method 200 may further comprise detecting the periodic structure (e.g., top or bottom grating) with which a parasitic grating is associated, and correcting the overlay measurements accordingly (stage 260). Parasitic gratings refer to secondary structure(s) embedded in the target, which diffracts some of the illumination in an angle different than the diffraction angle resulting from the primary structure of the target. Parasitic gratings commonly interact with radiation scattered by one or more of the target structures. If parasitic grating(s) are present and not desired, method 200 may be used to identify from which grating (top or bottom) parasitic grating(s) originate from, and possibly mitigate its effect on the measurements. By eliminating one or more periodic structure(s) in the additional cell(s) the association of the parasitic grating(s) may be identified and compensated for.

In certain embodiments, method 200 may comprise separating illumination asymmetry and grating asymmetry effects by measuring the additional cell(s) in at least two orientations, e.g., at 0° and 180° (rotation) (stage 270). The separation is then enabled as the asymmetric part that is associated with the target rotates, while the asymmetric part that is associated with the illumination does not rotate. As additional cell(s) comprise only a single periodic structure, these effects can be easily isolated and use to correct any of the overlay measurements, the illumination settings and/or the process steps. In certain embodiments in which an independently-measured reference image is obtained (e.g., by RIC or another periodic structure), the information from the additional cell(s) can be used to eliminate the effects of illumination asymmetry from the reference image, to make it reflect only the single grating asymmetry. Alternatively or complementarily, the information from the additional cell(s) may be normalized by an independently-measured reference image to isolate target asymmetry.

In certain embodiments, with additional cells having periodic structure at previous layers, method 200 may comprise measuring the additional cells and possibly structures of other cells during the production of these previous layers, and before the complete production of the targets. Certain embodiments comprise multiple temporal measurements of target structures as they are being processed (stage 280), to provide realtime feedback over production quality, even before completion of the targets, e.g., before the resist layer is applied onto the previous layers. For example, measuring target structures with only the bottom periodic structures should result in completely symmetric signals (as no upper periodic structures top the bottom structure and no offset is introduced yet) and any asymmetry may be identified as indicating a process defect, which can then be identified (e.g., as any of tool induced shift (TIS), wafer induced shift (WIS), target asymmetry etc.).

The multiple temporal measurements may be used to provide any of: flag(s) or gate(s) concerning whether the overlay measurements should be performed and/or used; calibration factor(s) for the overlay measurements, e.g., for modifying the measured signals to compensate for process errors, possibly taking into account adjustments relating to illumination spatial position, focus and dose adjustment etc.

Advantageously, multiple temporal measurements of target structures as they are being processed does not require additional wafer space (real estate), and may be applied sporadically or only when required to avoid excessive temporal delays. For example, multiple temporal measurements of target structures as they are being processed may be applied to layers that are identified or suspected as problematic, possibly based on earlier measurement or design considerations. In certain embodiments, multiple temporal measurements may be performed only in a mitigation mode of the metrology tool, applicable for such cases. In certain embodiments, such mitigation modes may apply separate measurement to multiple target layers, and possibly under two or more rotation states (e.g., 0° and 180°) to separate process errors from illumination errors.

Advantageously, disclosed targets and methods provide new ways of lithographic purpose control for target health monitoring, system calibration and automatic recipe optimization (ARO). Advantageously, disclosed targets and methods enable the measurements of overlay in layers that are not accessible in the prior art, while potentially avoiding the need for an external time-costly reference image creation procedure, by optionally providing reference images inline, and without hardware modification other than the disclosed target modifications, and with straight forward software adaptation.

Aspects of the present invention are described above with reference to flowchart illustrations and/or portion diagrams of methods, apparatus (systems) and computer program products according to embodiments of the invention. It will be understood that each portion of the flowchart illustrations and/or portion diagrams, and combinations of portions in the flowchart illustrations and/or portion diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or portion diagram or portions thereof.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or portion diagram or portions thereof.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or portion diagram or portions thereof.

The aforementioned flowchart and diagrams illustrate the architecture, functionality, and operation of possible implementations of systems, methods and computer program products according to various embodiments of the present invention. In this regard, each portion in the flowchart or portion diagrams may represent a module, segment, or portion of code, which comprises one or more executable instructions for implementing the specified logical function(s). It should also be noted that, in some alternative implementations, the functions noted in the portion may occur out of the order noted in the figures. For example, two portions shown in succession may, in fact, be executed substantially concurrently, or the portions may sometimes be executed in the reverse order, depending upon the functionality involved. It will also be noted that each portion of the portion diagrams and/or flowchart illustration, and combinations of portions in the portion diagrams and/or flowchart illustration, can be implemented by special purpose hardware-based systems that perform the specified functions or acts, or combinations of special purpose hardware and computer instructions.

In the above description, an embodiment is an example or implementation of the invention. The various appearances of "one embodiment", "an embodiment", "certain embodiments" or "some embodiments" do not necessarily all refer to the same embodiments. Although various features of the invention may be described in the context of a single embodiment, the features may also be provided separately or in any suitable combination. Conversely, although the invention may be described herein in the context of separate embodiments for clarity, the invention may also be implemented in a single embodiment. Certain embodiments of the invention may include features from different embodiments disclosed above, and certain embodiments may incorporate elements from other embodiments disclosed above. The disclosure of elements of the invention in the context of a specific embodiment is not to be taken as limiting their use in the specific embodiment alone. Furthermore, it is to be understood that the invention can be carried out or practiced in various ways and that the invention can be implemented in certain embodiments other than the ones outlined in the description above.

The invention is not limited to those diagrams or to the corresponding descriptions. For example, flow need not move through each illustrated box or state, or in exactly the same order as illustrated and described. Meanings of technical and scientific terms used herein are to be commonly understood as by one of ordinary skill in the art to which the invention belongs, unless otherwise defined. While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

What is claimed is:

1. A scatterometry overlay target comprising at least three cells associated with a measurement direction, wherein two of the at least three cells comprise periodic structures at different target layers, having a same pitch and opposite offsets between the two cells, wherein at least a third cell of the at least three cells comprises a periodic structure with the same pitch at only one of the target layers, and wherein the periodic structure of at least the third cell is continuous across three cells; wherein at least the third cell adjoins at least one of the two cells.

2. The target of claim 1, wherein at least the third cell comprises a single cell positioned adjacent to the two cells with periodic structures at different target layers and opposite offsets.

3. The target of claim 1, wherein at least the third cell comprises at least one cell positioned adjacent to the two cells with periodic structures at different target layers and opposite offsets, wherein the at least one cell is positioned to separate, spatially, the target from other wafer structures.

4. The target of claim 1, wherein at least the third cell comprises at least one cell positioned adjacent to the two cells with periodic structures at different target layers and opposite offsets, wherein the at least one cell is positioned on an edge of a pad holding the two cells.

5. The target of claim 1, wherein at least the third cell is located on a different pad than the two cells with periodic structures at different target layers and opposite offsets.

6. The target of claim 1, wherein at least the third cell comprises at least two cells, and wherein the at least two cells have the periodic structures at the different target layers.

7. The target of claim 6, wherein the different target layers comprise a previous layer and a current layer and wherein one of the at least two cells comprises the periodic structure at the previous layer and another one of the at least two cells comprises the periodic structure at the current layer.

8. The target of claim 1, wherein at least the third cell comprises a single cell positioned between the two cells with periodic structures at different target layers and opposite offsets.

9. The target of claim 8, wherein the different target layers comprise a previous layer and a current layer and wherein the single cell comprises the periodic structure at the previous layer.

10. The target of claim 8, wherein the different target layers comprise a previous layer and a current layer and wherein the single cell comprises the periodic structure at the current layer.

11. A method comprising incorporating in a scatterometry overlay target comprising two cells with periodic structures at different target layers, having a same pitch and opposite offsets between the two cells, at least a third cell comprising a periodic structure with the same pitch at only one of the target layers, wherein the periodic structure of at least the third cell is continuous across three cells and at least the third cell adjoins at least one of the two cells.

12. The method of claim 11, wherein at least the third cell comprises a single cell positioned between and/or adjacent to the two cells.

13. The method of claim 11, wherein at least the third cell comprises at least two cells having the periodic structures in at least a previous and a current layers.

14. The method of claim 11, further comprising deriving an estimation of process-related inaccuracy from scatterometry measurements of at least the third cell and correcting a scatterometry overlay measurement based on the two cells by the process-related inaccuracy estimation.

15. The method of claim 11, further comprising deriving an estimation of illumination-related inaccuracy from pupil image measurements of at least the third cell and correcting a scatterometry overlay measurement based on the two cells by the illumination-related inaccuracy estimation.

16. The method of claim 11, further comprising estimating, from scatterometry measurements of at least the third cell, target health and indicating faulty process steps which reduce the estimated target health.

17. The method of claim 11, further comprising correcting overlay measurements of the two cells in the target, using scatterometry measurements of at least the third cell.

18. The method of claim 11, further comprising calibrating metrology simulations through intermediate measurement results derived from scatterometry measurements of at least the third cell.

19. The method of claim 11, further comprising detecting, using scatterometry measurements of at least the third cell, the periodic structure with which a parasitic grating is associated, and correcting overlay measurements of the two cells in the target, accordingly.

20. The method of claim 11, further comprising separating illumination asymmetry and periodic structure asymmetry effects by carrying out scatterometry measurements of at least the third cell in at least two orientations.

21. The method of claim 11, further comprising deriving a reference image from pupil images of at least the third cell.

22. The method of claim 21, wherein the derivation of the reference image from the pupil images is carried out inline.

23. The method of claim 11, further comprising carrying out scatterometry measurements of at least the third cell, having the periodic structure in a previous layer, before complete production of the target.

24. The method of claim 23, further comprising carrying out multiple temporal measurements of target structures of at least the third cell, as they are being processed, to provide realtime feedback over production quality.

25. A computer program product comprising a non-transitory computer readable storage medium having computer readable program embodied therewith, the computer readable program configured to carry out the method of claim 11.

26. A metrology module comprising the computer program product of claim 25.

* * * * *